(12) United States Patent
Van Buul et al.

(10) Patent No.: US 9,362,525 B2
(45) Date of Patent: Jun. 7, 2016

(54) OLED DEVICE IN CONTACT WITH A CONDUCTOR

(71) Applicant: Koninklijke Philips N.V., Eindhoven (NL)

(72) Inventors: Jeroen Henri Antoine Maria Van Buul, Budel (NL); Holger Schwab, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 14/183,974

(22) Filed: Feb. 19, 2014

(65) Prior Publication Data

US 2014/0167023 A1    Jun. 19, 2014

Related U.S. Application Data

(63) Continuation of application No. 13/061,589, filed as application No. PCT/IB2009/053764 on Aug. 28, 2009, now Pat. No. 8,679,867.

(30) Foreign Application Priority Data

Sep. 9, 2008   (EP) ..................................... 08105269

(51) Int. Cl.
*H01L 51/52*   (2006.01)
*H01L 23/538*   (2006.01)
*H01L 23/00*   (2006.01)

(52) U.S. Cl.
CPC ........ *H01L 51/5253* (2013.01); *H01L 23/5384* (2013.01); *H01L 24/05* (2013.01); *H01L 24/85* (2013.01); *H01L 51/5237* (2013.01); *H01L 24/45* (2013.01); *H01L 51/5203* (2013.01);

(Continued)

(58) Field of Classification Search
CPC .................. H01L 51/5253; H01L 23/5384
USPC .................. 257/40, 88–103, E33.072
See application file for complete search history.

(56) References Cited

U.S. PATENT DOCUMENTS 4,640,584 A    2/1987  Tsubakimoto et al.
5,580,619 A    12/1996 Sakai et al.
(Continued)

FOREIGN PATENT DOCUMENTS

EP    1763287 A2    3/2007
EP    1811579 A1    7/2007
(Continued)

OTHER PUBLICATIONS

Anonymous: "Programmable Thermosonic Wire & Ribbon Wedge Bonder"-Model 676; Hybond Datasheet Description of Product, Downloaded From http://www.bita.lu/datasheets/HYB-676-LU.pdf, on Jan. 25, 2010. 2 Page Document.

*Primary Examiner* — Cuong Q Nguyen

(57) ABSTRACT

Disclosed is a method for contacting a device with a conductor 6, the device 1 comprising a substrate 2 with at least one cell 3, a contact region 4 and an encapsulation 5, wherein the encapsulation 5 encapsulates at least the contact region 4, the method comprising the steps of arranging the conductor 6 on the encapsulation 5, and interconnecting the conductor 6 with the contact region 4 without removing the encapsulation 5 between the conductor 6 and the contact region 4 beforehand. This invention is advantageous as the encapsulation 5 between the conductor 6 and the contact region 4 does not need to be removed beforehand anymore.

11 Claims, 1 Drawing Sheet

(52) U.S. Cl.
CPC ........... *H01L2224/04042* (2013.01); *H01L 2224/05599* (2013.01); *H01L 2224/45014* (2013.01); *H01L 2224/45124* (2013.01); *H01L 2224/45139* (2013.01); *H01L 2224/45147* (2013.01); *H01L 2224/48* (2013.01); *H01L 2224/85205* (2013.01); *H01L 2224/85375* (2013.01); *H01L 2224/85399* (2013.01); *H01L 2924/00014* (2013.01); *H01L 2924/014* (2013.01); *H01L 2924/0105* (2013.01); *H01L 2924/01013* (2013.01); *H01L 2924/01014* (2013.01); *H01L 2924/01024* (2013.01); *H01L 2924/01029* (2013.01); *H01L 2924/01033* (2013.01); *H01L 2924/01047* (2013.01); *H01L 2924/01049* (2013.01); *H01L 2924/05042* (2013.01); *H01L 2924/12044* (2013.01); *H01L 2924/20301* (2013.01); *H01L 2924/20302* (2013.01); *H01L 2924/20303* (2013.01); *H01L 2924/20304* (2013.01)

(56) References Cited

U.S. PATENT DOCUMENTS

| | | | |
|---|---|---|---|
| 6,520,821 | B1 | 2/2003 | Ishii et al. |
| 6,929,869 | B1 | 8/2005 | Wood et al. |
| 6,952,078 | B1 | 10/2005 | Guenther |
| 7,115,994 | B2 * | 10/2006 | Yaegashi ............. 257/758 |
| 7,256,483 | B2 | 8/2007 | Epler et al. |
| 2002/0187254 | A1 | 12/2002 | Ghosh et al. |
| 2003/0094691 | A1 | 5/2003 | Auch et al. |
| 2005/0035466 | A1 | 2/2005 | Chittipeddi et al. |
| 2006/0170114 | A1 | 8/2006 | Su et al. |
| 2006/0290271 | A1 | 12/2006 | Cok |
| 2006/0290276 | A1 | 12/2006 | Cok et al. |
| 2007/0065962 | A1 * | 3/2007 | Pichler ............. 438/47 |
| 2008/0297042 | A1 * | 12/2008 | Ahn et al. ............ 313/504 |
| 2009/0106726 | A1 * | 4/2009 | Feilchenfeld et al. ......... 716/12 |

FOREIGN PATENT DOCUMENTS

| | | |
|---|---|---|
| GB | 2378564 A | 2/2003 |
| JP | 58160927 A | 9/1983 |
| JP | 04136916 A | 5/1992 |
| JP | 08213435 | 8/1996 |
| JP | 2001176662 A | 6/2001 |
| JP | 2007073353 A | 3/2007 |
| TW | 200417283 A | 9/2004 |
| WO | 0021126 A1 | 4/2000 |
| WO | 2007135604 A2 | 11/2007 |

* cited by examiner

OLED DEVICE IN CONTACT WITH A CONDUCTOR

CROSS-REFERENCE TO RELATED APPLICATIONS

This application is a continuation of U.S. patent application Ser. No. 13/061589, which is a national stage filing of International Application Serial No. PCT/IB2009/053764, filed Aug. 28, 2009, which claims priority to EP 08105269.8, filed Sep. 9, 2008. Each of the aforementioned disclosures is incorporated herein by reference for all purposes.

FIELD OF THE INVENTION

The invention relates to the field of contacting a device with a conductor, and especially to the field of contacting an OLED device with a conductor.

BACKGROUND OF THE INVENTION

Organic LEDs (OLEDs) have several attractive features, such as great visual appearance, diffuse distributed light source, extremely thin or even flexible, options for transparency, mirror-like or black when off and almost complete 2D freedom in form. These properties make them ideally suited for signage applications, where luminating letters and graphic symbols of different sizes and colours are used to attract customers.

For certain application areas OLED devices have to be encapsulated in order to avoid water, moisture and/or air penetration from the environment into the device. Thin film encapsulation is one of the technologies used for avoiding such penetration into the device. The thin film encapsulation encapsulating the OLED device often comprises materials like silicon nitride, silicon carbid or aluminium oxide, and is frequently applied via a vacuum deposition process like plasma enhanced chemical vapor deposition (CVD).

In order to provide electrical connection to the OLED device, the encapsulation needs to be kept away from the contact electrodes of the OLED device. This can be achieved by using a masking process, i.e. the encapsulation is only deposited in the area of the OILED and not on the contact electrodes of the OLED.

However, the masking process is one of the main cost drivers for the deposition process of thin film encapsulation. In addition, the masking process causes yield losses due to mask handling and particle generation of the masking process.

SUMMARY OF THE INVENTION

It is the object of the invention to provide a possibility for contacting encapsulated OLED devices in an easy, convenient and inexpensive way.

This object is achieved by a method for contacting a device with a conductor, the device comprising a substrate with at least one cell, a contact region and an encapsulation, wherein the encapsulation encapsulates at least the contact region, the method comprising the steps of arranging the conductor on the encapsulation, and interconnecting the conductor with the contact region without removing the encapsulation between the conductor and the contact region beforehand.

Accordingly, the invention allows for interconnecting the conductor with the contact region without removing the encapsulation between the conductor and the contact region beforehand. This means that in contrast to the prior art, according to the invention, the encapsulation between the conductor and the contact region does not need to be removed prior to interconnecting the conductor with the contact region in a separate step. This means further that, and as well in contrast to the prior art, according to the invention, no expensive system for a masking process is necessary for preventing the deposition of the encapsulation in the area of the contact region and therefore avoiding yield losses due to mask handling and particle generation of the system required for the masking process. With respect to that, it is preferred that the contact region provides a connection, i.e. an electrical connection, to the cell.

Generally, it is possible to interconnect the conductor with the contact region in different ways. However, according to a preferred embodiment of the invention, interconnecting the conductor with the contact region comprises ultrasonic welding. This means that a join, i.e. an electrical joint, between the conductor and the contact region is preferably created by ultrasonic welding, wherein the ultrasonic welding energy melts the conductor and the contact region, thereby creating the joint. In this way the joint interconnects, i.e. electrically interconnects, the conductor with the contact region. This means further that the encapsulation between the conductor and the contact region is removed by the ultrasonic welding energy prior to creating the joint. Ultrasonic welding the conductor with the contact region is advantageous over the prior art as it does not require to remove the encapsulation between the conductor and the contact region beforehand, e.g. by a further process step.

According to another preferred embodiment of the invention, the encapsulation comprises a thin film. The encapsulation preferably prevents penetration of water, moisture and/or air from the environment into the encapsulated device.

Generally, the thin film may comprise different materials. However, according to another preferred embodiment of the invention, the thin film comprises an inorganic material and more preferably silicon nitride. It is further preferred that the thin film comprises silicon carbide, aluminum oxide or a mixture of the before-mentioned materials. The thin film is preferably applied via a vacuum deposition process like plasma enhanced chemical vapor deposition (CVD).

Furthermore, according to another preferred embodiment of the invention, the conductor comprises a metal wire. It is further preferred that the metal wire is flat and/or comprises copper, aluminum, silver, or a mixture of the before-mentioned materials. It is further preferred that the wire has a height of 200 µm and a width of 2 mm.

According to a further preferred embodiment of the invention, the contact region serves as an electrode for the cell. This means that the contact region preferably provides an electrically conductive connection to the cell for providing e.g. electrical power to the cell.

According to another preferred embodiment of the invention, the encapsulation encapsulates at least the contact region and the at least one cell. In other words, the encapsulation preferably encapsulates at least the device. In this way the encapsulated device is preferably protected against penetration of water, moisture and/or air from the environment into the device.

Generally, the method can be used for different devices. However, according to another preferred embodiment of the invention, the device comprises an OLED. It is further preferred that the cell is provided as an OLED, which is provided on the substrate, wherein electrical power can be provided to the OLED via the contact region.

According to another preferred embodiment of the invention, the ultrasonic welding operates between ≥10 kHz and ≤80 kHz, preferably between ≥30 kHz and ≤40 kHz and more preferably at 35 kHz. This means that the ultrasonic welding preferably emits a low-amplitude acoustic vibration between ≥15 kHz and 70 kHz, preferably between ≥30 kHz and ≤40 kHz and more preferably at 35 kHz.

The object of the invention is further achieved by a device comprising a substrate with at least one cell, a contact region and an encapsulation, and a conductor, wherein the encapsulation encapsulates at least the contact region and the conductor penetrates the encapsulation for interconnecting with the contact region through the encapsulation. In this way, the invention allows for interconnecting i.e. electrically interconnecting, the conductor with the contact region without removing the encapsulation between the conductor and contact region beforehand. This means further that no expensive masking system is required for preventing the deposition of the encapsulation in the area of the contact region and/or no additional process step is required to remove the encapsulation in the area of the contact region prior to interconnecting the conductor and the contact region.

With respect to this, according to another preferred embodiment of the invention, the conductor is connected with the contact region through the encapsulation by means of ultrasonic welding. This is advantageous over the prior art as ultrasonic welding the conductor with the contact region avoids removing the encapsulation in the area of the contact region prior to interconnecting the conductor and the contact region, given that the encapsulation in the area of the contact region is removed by the ultrasonic welding energy.

According to another preferred embodiment of the invention, the encapsulation comprises a thin film. It is preferred that the thin film comprises an inorganic material and more preferably silicon nitride. It is further preferred that the thin film comprises silicon carbide, aluminum oxide or a mixture of the before-mentioned materials. The thin film is preferably applied via a vacuum deposition process like plasma enhanced chemical vapor deposition (CVD). The encapsulation preferably prevents penetration of water, moisture and/or air from the environment into the encapsulated device.

Furthermore, according to another preferred embodiment of the invention, the contact region serves as an electrode for the cell. This means that the contact region preferably provides an electrically conductive connection to the cell for providing e.g. electrical power to the cell.

Generally, different devices can be used. However, according to another preferred embodiment of the invention, the device comprises an OLED. It is further preferred that the cell is provided as an OLED, which is provided on the substrate, wherein electrical power can be provided to the OLED via the contact region.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
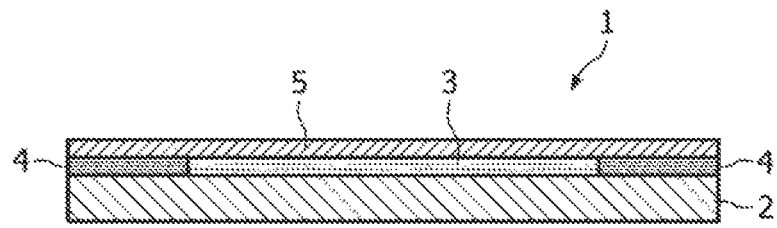
FIG. 1 shows a device which is to be processed according to a preferred embodiment of the invention.

From FIG. 1 a device 1 which is to be processed according to a preferred embodiment of the invention can be seen. The device 1 comprises a substrate 2 with a cell 3, a contact region 4 and an encapsulation 5. According to this preferred embodiment of the invention, the cell 3 is provided as an OLED, wherein electrical power is provided to the OLED via the contact region 4. This means that the contact region 4 connects, i.e. electrically connects, to the cathode or to the anode, respectively, of the OLED 3. The substrate 2 comprises glass or polymer. The OLED 3 consist of a layer stack comprising at least one light emitting organic layer arranged between electrodes being in electrical contact to the contact regions 4 to apply a driving voltage to the light emitting layer. The OLED layer stack is not shown in details here. The contact regions may comprise a transparent conductive material, e.g. indium-tin oxide (ITO), or made of metals such as copper, chromium or stacks of metals such as chromium-aluminum-chromium.

The encapsulation 5 encapsulates the cell 3 and the contact region 4. This means further that the encapsulation 5 also encapsulates the substrate 2 on the side, where the cell 3 and the contact region 4 are provided to the substrate 2. The encapsulation 5 is provided as a thin film, which comprises silicon nitride according to the preferred embodiment of the invention, more preferably with a thickness between 100 nm and 500 nm.

Figure 2:
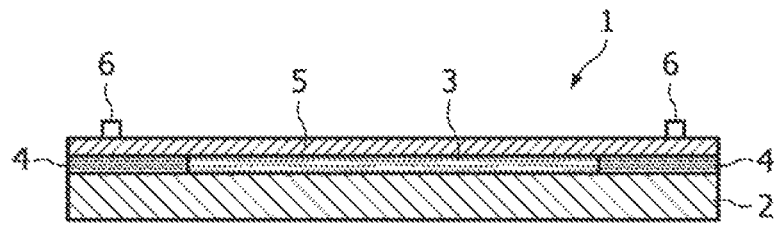
FIG. 2 shows the device which is processed with a conductor according to the preferred embodiment of the invention.

FIG. 2 shows the device 1 and a conductor 6 prior to interconnecting the conductor 6 to the contact region 4. The conductor 6 comprises a metal wire, wherein the metal wire is flat and/or comprises copper, aluminium or silver, and is arranged on the encapsulation 5 in the area of the contact region 4. The preferred cross section of the conductor 6 to improve the welding process is a rectangular cross section, where the height of the wire is significantly smaller than the width. One example is an aluminum wire with a height of 200 μm and a width of 2 mm.

Figure 3:
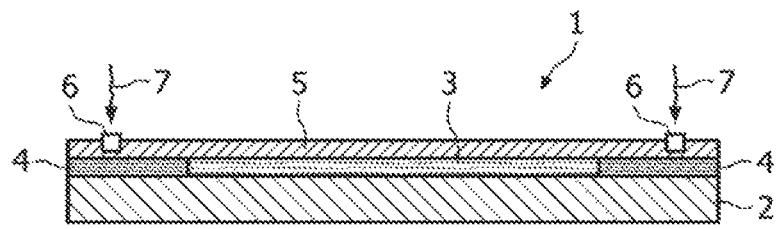
FIG. 3 shows the device while interconnecting the conductor according to the preferred embodiment of the invention.

FIG. 3 shows the device 1 while interconnecting the conductor 6 with the contact region 4. As it can be seen, the encapsulation 5 between the conductor 6 and the contact region 4 is not removed beforehand the interconnection.

Interconnecting the conductor 6 with the contact region 4 is carried out by ultrasonic welding indicated by arrows 7. The conductor 6 is placed on top of the encapsulation 5. The ultrasonic welding head (not shown here) is placed above the conductor 6, preferably in mechanical contact to the conductor 6. The diameter of the welding head may be adapted to the dimensions of the conductor 6. The ultrasonic welding is preferably operated at 35 KHz, using 30 Ws, 80% duty cycle and 0.4 bar pressure. Typical welding times are below 30 sec depending on the conductor and the encapsulation. As it can be seen further from FIG. 3, the conductor 6 removes the encapsulation 5 while interconnecting with the contact region 4, i.e. the ultrasonic welding energy removes the encapsulation 5 while ultrasonic welding the conductor 6 to the contact region 4.

Figure 4:
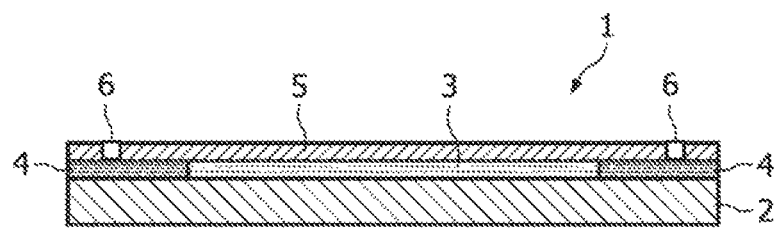
FIG. 4 shows the device with the interconnected conductor according to the preferred embodiment of the invention.

Further, from FIG. 4 the device 1 can be seen with the conductor 6 interconnected to the contact region 4, i.e. the conductor 6 provides an electrical connection with the contact region 4. The resistance of the electrical connection (resistance between conductor and contact region) is below 1 Ω.

In this way, the invention provides a simple and cost-efficient method for contacting an encapsulated OLED, which is encapsulated by an encapsulation 5, without prior removing the encapsulation 5 in the area of the contact region 4 or without using an expensive masking system for preventing the deposition of the encapsulation 5 in the area of the contact region 4.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device, comprising:
    a substrate comprising at least one cell, a contact region that serves as an electrode of the at least one cell, and an encapsulation; and
    a conductor, which penetrates the encapsulation,
    wherein the conductor is connected to a surface of the contact region,
    wherein the encapsulation encapsulates at least the contact region, and
    wherein the conductor is a wire and the cross section of the wire is configured such that a width of the cross section is at least an order of magnitude larger than a height of the cross section.

2. The device according to claim 1, wherein the conductor is connected with the contact region through the encapsulation by means of ultrasonic welding.

3. The device according to claim 1, wherein the encapsulation comprises a thin film.

4. The device according to claim 1, wherein the device comprises an OLED.

5. The device according to claim 1, wherein the height of the cross-section is hundreds of micrometers.

6. The device according to claim 1, wherein said height is a dimension that is perpendicular to the surface of the contact region.

7. A device, comprising:
    a substrate comprising at least one cell, a contact region that serves as an electrode of the at least one cell, and an encapsulation; and
    a conductor, which penetrates the encapsulation,
    wherein the conductor is connected to a surface of the contact region,
    wherein the encapsulation encapsulates at least the contact region, and
    wherein the conductor is disposed laterally from said at least one cell.

8. The device of claim 7, wherein the at least one cell includes at least one light-emitting layer disposed laterally from the contact region.

9. The device of claim 8, wherein the device further comprises a second contact region that serves as a second electrode disposed laterally from said at least one light-emitting layer such that said at least one light-emitting layer is between said first and second contact regions.

10. The device of claim 9, wherein the at least one light-emitting layer is an organic light emitting layer.

11. The device of claim 7, wherein the conductor is a wire and the cross section of the wire is configured such that a width of the cross section is at least an order of magnitude larger than a height of the cross section.

* * * * *